(12) United States Patent
Loheit et al.

(10) Patent No.: US 7,139,319 B2
(45) Date of Patent: *Nov. 21, 2006

(54) WIRELESS RF LINK FOR UNCOMPRESSED TRANSMISSION OF HDTV SIGNALS

(75) Inventors: Kurt W. Loheit, Rolling Hills Estates, CA (US); William A. Salter, Torrance, CA (US)

(73) Assignee: The Boeing Company, Chicago, IL (US)

( * ) Notice: Subject to any disclaimer, the term of this patent is extended or adjusted under 35 U.S.C. 154(b) by 304 days.

This patent is subject to a terminal disclaimer.

(21) Appl. No.: 10/406,931

(22) Filed: Apr. 3, 2003

(65) Prior Publication Data

US 2004/0196920 A1    Oct. 7, 2004

(51) Int. Cl.
*H04L 27/00* (2006.01)

(52) U.S. Cl. ............... 375/259; 375/279; 375/308; 375/329; 348/553; 348/723; 348/725

(58) Field of Classification Search ........... 375/259, 375/301, 281, 261, 270, 279, 295, 298, 308, 375/316, 377, 355, 354; 348/553, 571, 723–726, 348/729; 386/1, 37, 38, 46, 66, 117, 124
See application file for complete search history.

(56) References Cited

U.S. PATENT DOCUMENTS

| | | | | |
|---|---|---|---|---|
| 4,996,718 A | * | 2/1991 | Shiomi | 455/323 |
| 5,136,375 A | * | 8/1992 | Citta et al. | 348/390.1 |
| 5,267,021 A | * | 11/1993 | Ramchandran et al. | 348/469 |
| 5,412,351 A | * | 5/1995 | Nystrom et al. | 332/103 |
| 5,477,199 A | * | 12/1995 | Montreuil | 332/103 |
| 5,519,444 A | * | 5/1996 | Ko et al. | 348/515 |
| 5,881,107 A | * | 3/1999 | Termerinac et al. | 375/279 |
| 6,091,702 A | * | 7/2000 | Saiki | 370/203 |
| 6,185,255 B1 | * | 2/2001 | Twitchell et al. | 375/240.25 |
| 6,621,366 B1 | * | 9/2003 | Gentile | 332/103 |
| 2004/0100588 A1 | * | 5/2004 | Hartson et al. | 348/608 |
| 2004/0223553 A1 | * | 11/2004 | Kumar | 375/259 |

OTHER PUBLICATIONS

U.S. Appl. No. 10/071,954, Loheit et al.
"Loea Virtual Fiber Used For Elevated Distance Shots of Super Bowl XXXVII Technology originally developed for the military", Press Release, Jan. 28, 2003, Loea Corporation, San Diego, CA.

* cited by examiner

*Primary Examiner*—Jean B Corrielus
(74) *Attorney, Agent, or Firm*—Ingrassia Fisher & Lorenz, P.C.

(57) ABSTRACT

A method for transmitting and receiving an uncompressed HDTV signal over a wireless RF link includes steps of: providing a clock signal synchronized to the uncompressed HDTV signal; and providing a stream of regenerated data from the uncompressed HDTV signal, with the clock signal synchronized to the stream of regenerated data. The clock signal is then used for demultiplexing the stream of regenerated data into an I data stream and a Q data stream. The method further includes steps of: modulating a carrier with the I data stream and the Q data stream; transmitting the carrier over the wireless RF link; demodulating the carrier so that the I data stream and the Q data stream are recovered; multiplexing the I data stream and the Q data stream into a single stream of HDTV data; and recovering the uncompressed HDTV signal from the single stream of HDTV data.

44 Claims, 5 Drawing Sheets

WIRELESS RF LINK FOR UNCOMPRESSED TRANSMISSION OF HDTV SIGNALS

BACKGROUND OF THE INVENTION

The present invention generally relates to wireless radio frequency (RF) systems for RF transmission and reception of high definition television (HDTV) signals and, more particularly, to a method for providing a wireless RF communication link for transmitting uncompressed HDTV signals.

Common approaches for RF transmission of HDTV signals digitally compress the HDTV signal to address problems due to bandwidth and modulation limitations. For example, uncompressed transmission of HDTV signals occurs at a data rate of 1.485 giga-bits per second (Gbps), a data rate that is too high to be accommodated by conventional, low-bandwidth RF transmission. Digital compression reduces the data rate so that conventional, low-bandwidth RF transmission can be used. The resulting HDTV signal must be decompressed at the destination or receiving end of the RF link. The signal compression and decompression can generate artifacts that degrade the signal quality, and begin to negate the high picture quality specified by HDTV. In addition, latency generated by compression/decompression, i.e., the time delay between generation of the uncompressed HDTV signal and reception of the decompressed HDTV signal after compression and decompression, creates a time delay unacceptable for live broadcast synchronization.

It can be impractical, however, to use current, lower bandwidth, wireless RF systems to transmit uncompressed HDTV signals because complex and costly modulation and coding schemes are required to achieve reasonable HDTV performance. The Society of Motion Pictures and Television Engineers (SMPTE) standard 292M defines the electrical characteristics of the high definition HDTV signal. SMPTE standards also define the acceptable transmission medium for HDTV. For example, fiber optic cable, coaxial cable, and RF wireless transmission are all acceptable transmission media for HDTV signals.

HDTV signal transmission, for example, at an event or filming site, using any of the current cable, fiber optic, or wireless RF transmission capabilities, is subject to a variety of shortcomings. For example, if fiber optic cables are used they usually must be pre-installed at the event or filming site. Cables generally require permits to be obtained in advance and the time and cost for installation of cables can impose constraints on televising the event or filming. Fiber optic cables can be aesthetically undesirable, frequently unsafe, and often logistically impossible. For example fiber optic cables are usually buried months in advance for some golf events, and television engineers complain that a major headache in covering stadium sports events is the problem of fans tripping over their cables. Wireless RF transmission typically suffers from the digital compression problems, as described above, due to the limited bandwidth available using conventional, low-bandwidth RF transmission.

Television studios are now in the process of converting all of their broadcast productions exclusively to HDTV. In order for a high definition RF camera system to provide the same functionality as standard definition (SD), it is necessary to use an uncompressed digital link. Using an uncompressed link eliminates delays introduced by compression encoding and decoding. Such delays are unacceptable because they introduce production difficulties. Although wireless RF transmission of uncompressed HDTV signals has been achieved, for example, at a recent Super Bowl event, the RF transmission of uncompressed HDTV signals has been accomplished using on/off keying modulation. On/off keying is an inefficient form of modulation which imposes several limitations, for example, limited range, and which requires employing extremely high frequency radio waves in the 71–76 gigahertz (GHz) range, also known as V band (40–75 GHz) and W band (75–110 GHz), in order to accommodate the high, 1.485 Gbps, data rate.

RF transmission at such extremely high frequencies, however, also entails a number of technical difficulties. Technical difficulties for extremely high frequency RF transmission may include, for example, distortion due to the bandwidth required for high data rate, providing adequate transmit power, limitations on range, and antenna design tradeoffs. Link designs must trade between distance, effective radiated power (ERP), bit error rate (BER) performance, forward error correction, link margin, and component availability to develop a usable system. These technical difficulties become more critical in a portable wireless RF transmission system. Using modulators and receivers capable of performing at the 1.485 Gbps rate, an HDTV signal from a source—such as an HDTV camera or recorder—could be transmitted uncompressed to the proper facility for production—such as a local studio facility. Portable systems for transmission of uncompressed HDTV signals over wireless RF links could allow a portable hand-held camera to move from location to location within the receiver range, making HDTV transmission of sporting events or electronic newsgathering in real time possible. The ability to connect real-time to studios for instant direction and editing could offer the prospect of greatly reduced cost and cycle time for content creation.

As can be seen, there is a need for transmitting and receiving uncompressed HDTV signals over a wireless RF link. Also there is a need for high bandwidth, wireless RF links allowing the transmission of HDTV digital signals at the full 1.485 Gbps rate, that can be realized in a portable system that provides a quick, easy set-up where one HDTV signal can be transmitted and received over each link.

SUMMARY OF THE INVENTION

In one aspect of the present invention, a method for transmitting and receiving an uncompressed HDTV signal over a wireless RF link, includes steps of: providing a clock signal synchronized to the uncompressed HDTV signal; and providing a stream of regenerated data from the uncompressed HDTV signal, with the clock signal synchronized to the stream of regenerated data. The clock signal is then used for demultiplexing the stream of regenerated data into an I data stream and a Q data stream. The method further includes steps of: modulating a carrier with the I data stream and the Q data stream; transmitting the carrier over the wireless RF link; demodulating the carrier so that the I data stream and the Q data stream are recovered; multiplexing the I data stream and the Q data stream into a single stream of HDTV data; and recovering the uncompressed HDTV signal from the single stream of HDTV data.

In another aspect of the present invention, a method for transmitting an uncompressed HDTV signal over a wireless RF link includes steps of: providing a stream of regenerated data from the uncompressed HDTV signal; providing a first clock signal synchronized to the stream of regenerated data; encoding the stream of regenerated data, producing a stream of encoded data; providing a second clock signal synchronized to the stream of encoded data; demultiplexing the stream of encoded data, using the second clock signal, into an I data stream and a Q data stream; modulating a carrier with the I data stream and the Q data stream; and transmitting the carrier over the wireless RF link.

In still another aspect of the present invention, a method for receiving an uncompressed HDTV signal over a wireless RF link includes steps of: receiving the carrier over the wireless RF link; demodulating the carrier so that the I data stream and the Q data stream are recovered; multiplexing the I data stream and the Q data stream into a single stream of HDTV data; and decoding the single stream of HDTV data so that the uncompressed HDTV signal is recovered.

In yet another aspect of the present invention, a method for transmitting and receiving an uncompressed HDTV signal over a wireless RF link includes steps of: providing a stream of regenerated data having a first data rate of 1.485 Gbps from the uncompressed HDTV signal; providing a first clock signal, using edge detection of the stream of regenerated data to generate the first clock signal, and synchronize it to the stream of regenerated data; encoding the stream of regenerated data using a forward error correction code, producing a stream of encoded data having a second data rate higher than the first data rate by a coding overhead of the forward error correction code; providing a second clock signal using edge detection of the stream of encoded data to generate the second clock signal synchronized to the stream of encoded data, the second clock signal having a rate higher than the first clock signal by the coding overhead; demultiplexing the stream of encoded data, using the second clock signal, into an I data stream and a Q data stream; and QPSK modulating an IF carrier with the I data stream and the Q data stream.

The method also includes steps of: up converting the IF carrier to an RF carrier; transmitting the RF carrier over the wireless RF link; receiving the RF carrier over the wireless RF link; down converting the RF carrier to an IF frequency signal having frequency greater than 1.5 GHz and less than 6 GHz; demodulating the IF frequency signal so that the I data stream and the Q data stream are recovered; generating a third clock signal from the I data stream and the Q data stream, the third clock signal synchronized to the I data stream and the Q data stream; multiplexing the I data stream and the Q data stream, using the third clock signal, into a single stream of HDTV data; and decoding the single stream of HDTV data, using the third clock signal, so that the uncompressed HDTV signal is recovered.

In a further aspect of the present invention, a method of providing a wireless RF link for an HDTV system includes steps of: performing data regeneration on an uncompressed HDTV signal that produces a stream of regenerated HDTV data; synchronizing a first clock signal to the stream of regenerated HDTV data; encoding the stream of regenerated HDTV data, producing a stream of encoded data; synchronizing a second clock signal to the stream of encoded data; demultiplexing the stream of encoded data, using the second clock signal, into an I data stream and a Q data stream; and modulating a carrier with the I data stream and the Q data stream. The method further includes steps of: transmitting the carrier over the wireless RF link; receiving the carrier over the wireless RF link; demodulating the carrier so that the I data stream and the Q data stream are recovered; generating a third clock signal from the I data stream and the Q data stream, the third clock signal being synchronized to the I data stream and the Q data stream; using the third clock signal to multiplex the I data stream and the Q data stream into a single stream of HDTV data; and decoding the single stream of HDTV data so that the uncompressed HDTV signal is recovered.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, one embodiment of the present invention provides a method for transmitting and receiving uncompressed high definition television (HDTV) signals over a wireless RF link. The HDTV digital signals may be generated, for example, from an HDTV camera, stored HDTV source or memory, or recorded images. One embodiment provides high bandwidth, wireless RF links allowing the transmission of HDTV digital signals at the full 1.485 giga-bit per second (Gbps) rate, according to the Society of Motion Pictures and Television Engineers (SMPTE) standard 292M, for a portable system where one HDTV signal can be transmitted and received over each link. One embodiment may incorporate high-speed modulation to achieve line of sight RF links up to 10 kilometers in range. Such high speed modulation is described in U.S. patent application Ser. No. 10/071,954, filed Feb. 6, 2002, titled "High Speed QPSK MMIC and QAM Modulator", having assignee in common with the present invention, and incorporated herein by reference. One embodiment may also incorporate an apparatus for wireless RF transmission of uncompressed HDTV signals as described in U.S. patent application Ser. No. 10/408,002, filed concurrently with the present application, having assignee in common with the present invention, and incorporated herein by reference.

HDTV systems as specified by SMPTE standard 292M are clockless systems, i.e., the HDTV signal is not synchronized with a clock. In one embodiment, clock synchronization is provided to an HDTV signal so that efficient modulation schemes—such as QPSK and QAM—may be used to modulate the RF carrier with the HDTV data. Thus, the high data rate HDTV data at 1.485 Gbps may be efficiently modulated so that less bandwidth is required to transmit the signal over an RF link in accordance with an embodiment of the present invention. Therefore, in contrast to the prior art, RF links in accordance with an embodiment of the present invention may operate at a variety of frequency bands from 18 GHz up to 110 GHz. The RF links may be implemented as fixed or portable operation, and links may be one way (simplex) or full two-way (duplex). HDTV signals may be transmitted on the RF links from cameras or other HD sources to recorders, local studio facilities, or between studios for processing or distribution.

Figure 1A:
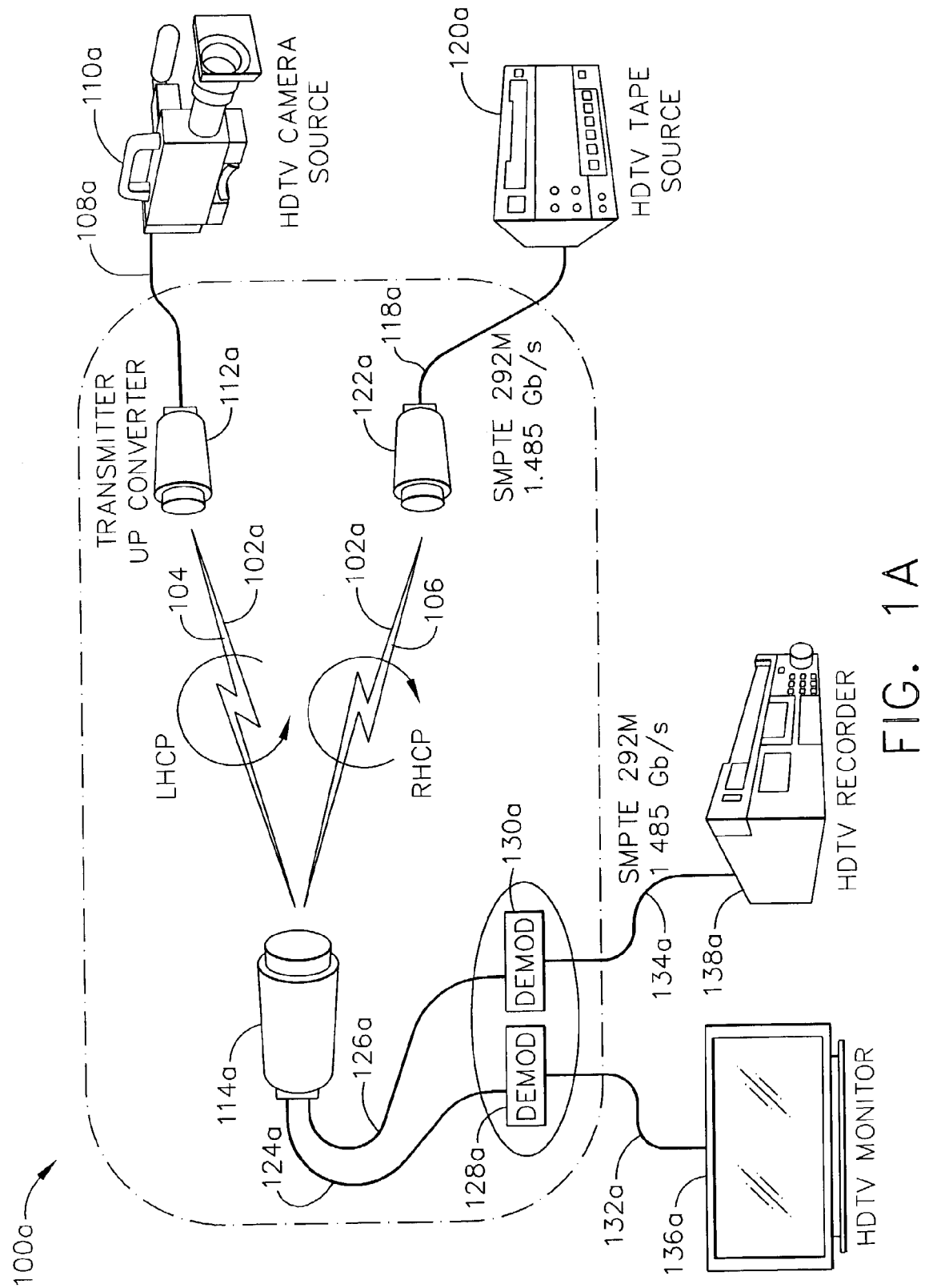
FIG. 1A is a system diagram showing an exemplary HDTV system using dual polarization (i.e. frequency re-use) to transmit two uncompressed HDTV signals over a single RF channel, according to an embodiment of the present invention.
Figure 1B:
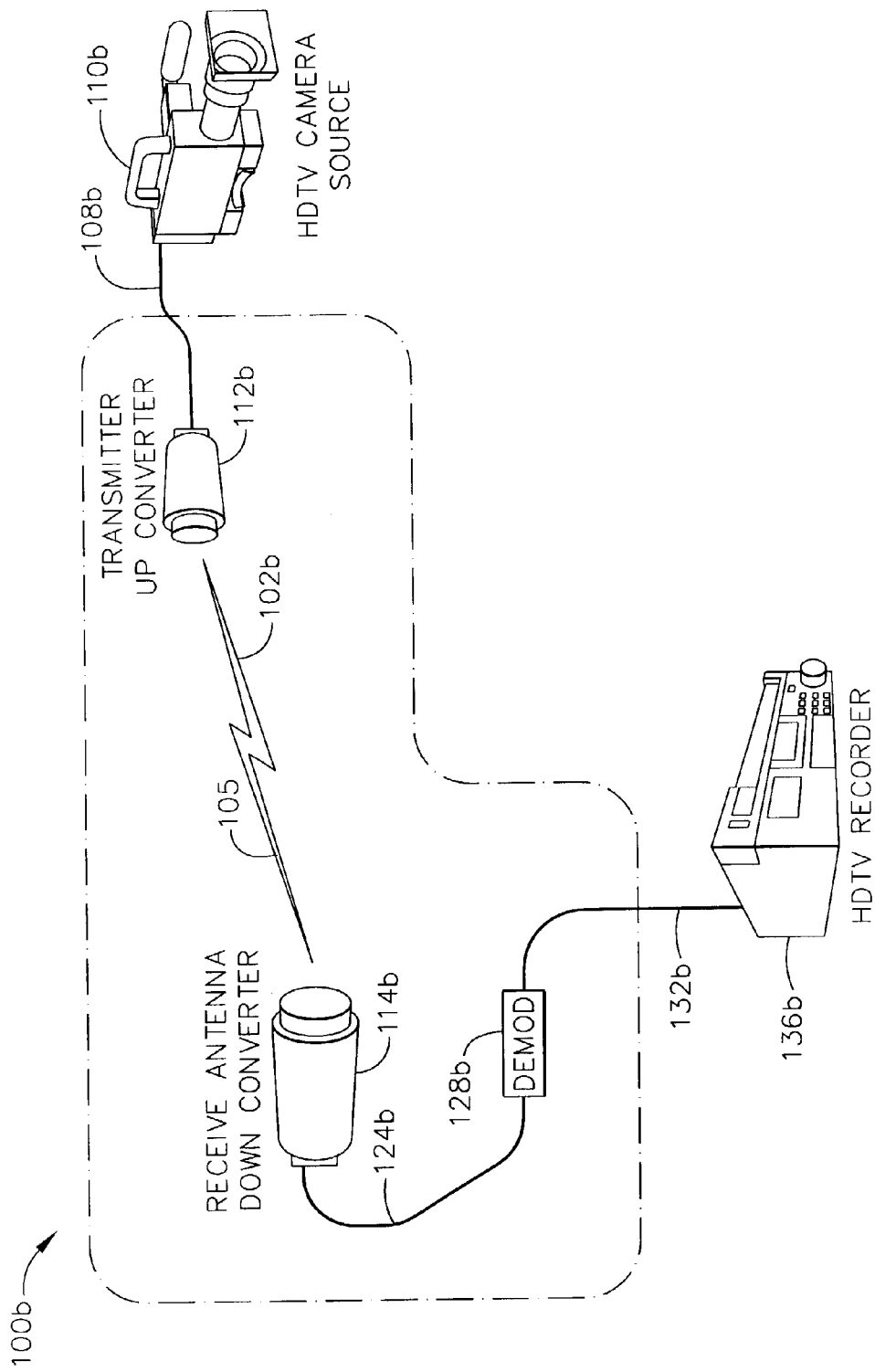
FIG. 1B is a system diagram showing an exemplary HDTV system with a wireless RF link transmitting uncompressed HDTV signals, according to an embodiment of the present invention.

Referring now to FIGS. 1A and 1B, FIG. 1A illustrates an exemplary HDTV system 100a according to one embodiment and FIG. 1B illustrates an exemplary HDTV system 100b according to another embodiment. System 100a may include an RF channel 102a. A dual polarization technique may be used with RF channel 102a to provide signal transmission via left-hand circular polarization (LHCP) 104 and right-hand circular polarization (RHCP) 106 for frequency re-use over a single channel. System 100b may include an RF channel 102b. A single polarization or a conventional technique may be used with RF channel 102b, allowing one signal to be transmitted over the RF channel 102b.

System 100a may transmit an uncompressed HDTV signal 108a from source 110a, which may be, for example, an HDTV camera as shown in FIG. 1A. System 100a may transmit uncompressed HDTV signal 108a using transmitter 112a with the dual polarization technique to provide transmission via LHCP 104 over RF channel 102a to receiver 114a. Similarly, system 100a may transmit an uncompressed HDTV signal 118a from source 120a, which may be, for example, an HDTV tape source as shown in FIG. 1A. System 100a may transmit uncompressed HDTV signal 118a using transmitter 122a with the dual polarization technique to provide transmission via RHCP 106 over RF channel 102a to receiver 114a. HDTV signals 108a and 118a may conform to SMPTE standard 292M, and may have a data rate of 1.485 Gbps.

Receiver 114a may provide the received signal 124a corresponding to uncompressed HDTV signal 108a transmitted via LHCP 104, using dual polarization technique, over RF channel 102a to demodulator 128a. Similarly, receiver 114a may provide the received signal 126a corresponding to uncompressed HDTV signal 118a transmitted via RHCP 106, using dual polarization technique, over RF channel 102a to demodulator 130a. Demodulator 128a may provide an HDTV signal 132a to an HDTV device 136a, which may be, for example, an HDTV monitor as shown in FIG. 1A. Demodulator 130a may provide an HDTV signal 134a to an HDTV device 138a, which may be, for example, an HDTV recorder as shown in FIG. 1A. HDTV signals 132a and 134a may conform to Society of Motion Pictures and Television Engineers (SMPTE) standard 292M, and may have a data rate of 1.485 Gbps. HDTV signals 132a and 134a may be recovered, respectively, from HDTV signals 108a and 118a.

Single channel system 100b is simpler but operates similarly to system 100a. Thus, system 100b may transmit an uncompressed HDTV signal 108b from source 110b, which may be, for example, an HDTV camera as shown in FIG. 1B. System 100b may transmit uncompressed HDTV signal 108b using transmitter 112b, using conventional or single polarization techniques, over the link 105 of RF channel 102b to receiver 114b. HDTV signal 108b may conform to Society of Motion Pictures and Television Engineers (SMPTE) standard 292M, and may have a data rate of 1.485 Gbps.

Receiver 114b may provide the received signal 124b corresponding to uncompressed HDTV signal 108b received over link 105 of RF channel 102b to demodulator 128b. Demodulator 128b may provide an HDTV signal 132b to an HDTV device 136b, which may be, for example, an HDTV recorder as shown in FIG. 1B. HDTV signal 132b may conform to Society of Motion Pictures and Television Engineers (SMPTE) standard 292M, and may have a data rate of 1.485 Gbps. HDTV signal 132b may be recovered from HDTV signal 108b.

Figure 2:
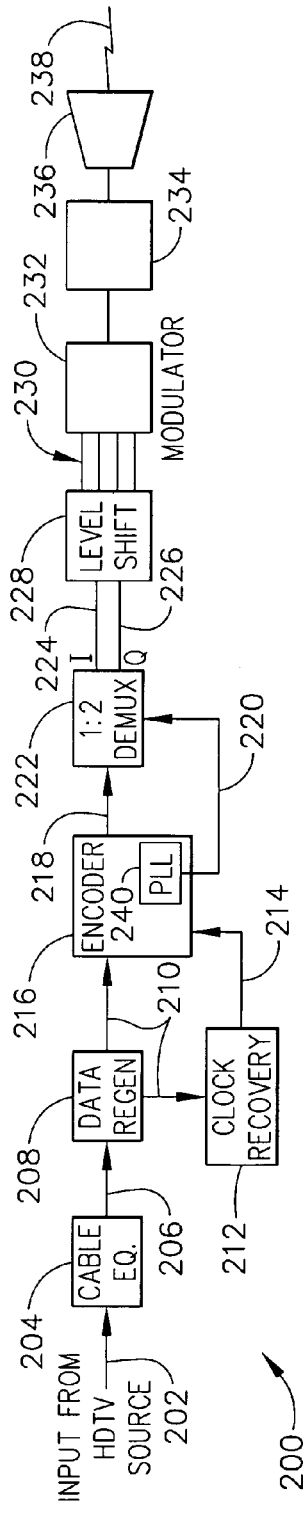
FIG. 2 is a block diagram illustrating transmission of uncompressed HDTV signals, according to an embodiment of the present invention.

Referring now to FIG. 2, transmission system 200 illustrates RF transmission of an uncompressed HDTV signal 202—such as signal 108a or 108b seen in FIGS. 1A and 1B—according to one embodiment. Uncompressed HDTV signal 202 may be equalized at module 204 to compensate for any cable distortions due to cable length or type that, for example, may cause signal 202 to not meet SMPTE 292M requirements. For example, equalization may be performed using commercially available equalization devices, as known in the art, so that equalized signal 206 meets the SMPTE 292M requirements. Data from equalized signal 206 may be regenerated at module 208 to provide regenerated data 210 so that a clock signal 214 synchronized to regenerated data 210 may be provided by clock 212. For example, clock recovery at clock 212 may be provided by edge-detection of regenerated data 210. Also, for example, clock recovery at clock 212 may be provided by passing regenerated data 210 through a "times 2" multiplier to generate a clock signal 214 synchronized to regenerated data 210.

Regenerated data 210 and clock signal 214 may be used to perform forward error correction coding (FEC) at module 216 to improve link performance. For example, Reed-Solomon coding, interleaving coding, or turbo product codes (TPC), as known in the art, may be used. FEC coding at module 216 requires adding redundancy to the signal (i.e. coding overhead) by intentionally adding bits to correct errors at the receiver without having to communicate back and forth with the transmitter for additional information on which bits are in error. Depending on the type of code used this can entail a coding overhead due to the additional capacity, increasing the data rate. Thus, encoded data 218 may be provided at a higher data rate, for example, 1.607 Gbps, and clock signal 220 is provided at the higher rate to match the higher rate encoded data 218, so that the rate of clock signal 220 is higher than the rate of clock signal 214 by the coding overhead. For example, a phase-locked loop (PLL) 240 included in module 216 may be used to generate the higher rate clock signal 220 and synchronize clock signal 220 to encoded data 218.

Clock signal 220 may be used as a timing source to demultiplex encoded data 218 into two data streams, an in-phase (I) data stream 224 and a quadrature (Q) data stream 226 at block 222 as shown in FIG. 2. The two synchronized data streams 224 and 226, which contain the data of the original uncompressed HDTV signal 202, may be used to provide efficient modulation of a carrier by the data of signal 202. For example, the amplitude and offset of the voltages representing the data streams 224 and 226 may be adjusted as illustrated by block 228 and appropriate inputs 230 may be provided to a modulator 232. Modulator 232 may be, for example, a quadrature phase shift keying (QPSK) or quadrature amplitude modulation (QAM) implementation on a monolithic microwave integrated circuits (MMIC) chip, as described above. For example, an oscillator (i.e. frequency source) may provide the center frequency at which modulator 232 operates, typically between 18 GHz and 23 GHz depending on frequency upconversion spur analysis, as known in the art. Modulator 232 output may be a QPSK waveform that may then be frequency upconverted at block 234 to an appropriate transmit frequency. The frequency translation at block 234 may combine a QPSK waveform with a converting oscillator to generate a desired transmit frequency. For example, the minimum required bandwidth necessary for a 1.485 Gbps QPSK waveform with error correction coding overhead may be approximately 900 MHz. The modulated carrier 238 may be broadcast by an antenna 236 over a wireless RF link—such as link 102*a* or 102*b*, seen in FIGS. 1A and 1B.

Figure 3A:
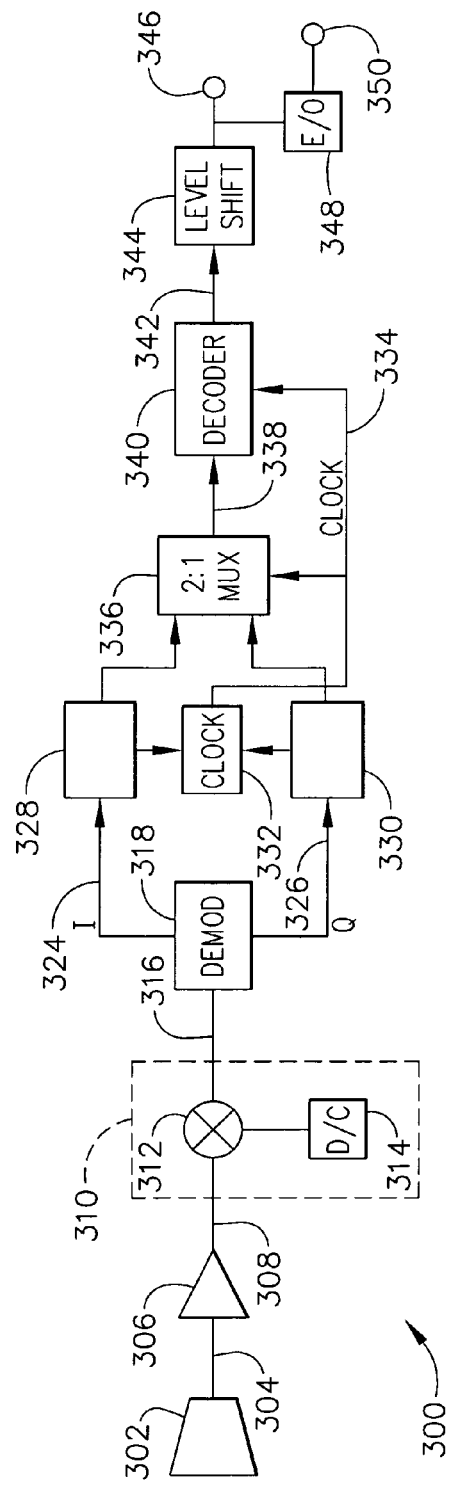
FIG. 3A is a block diagram illustrating single-polarization reception of uncompressed HDTV signals, according to one embodiment of the present invention.
Figure 3B:
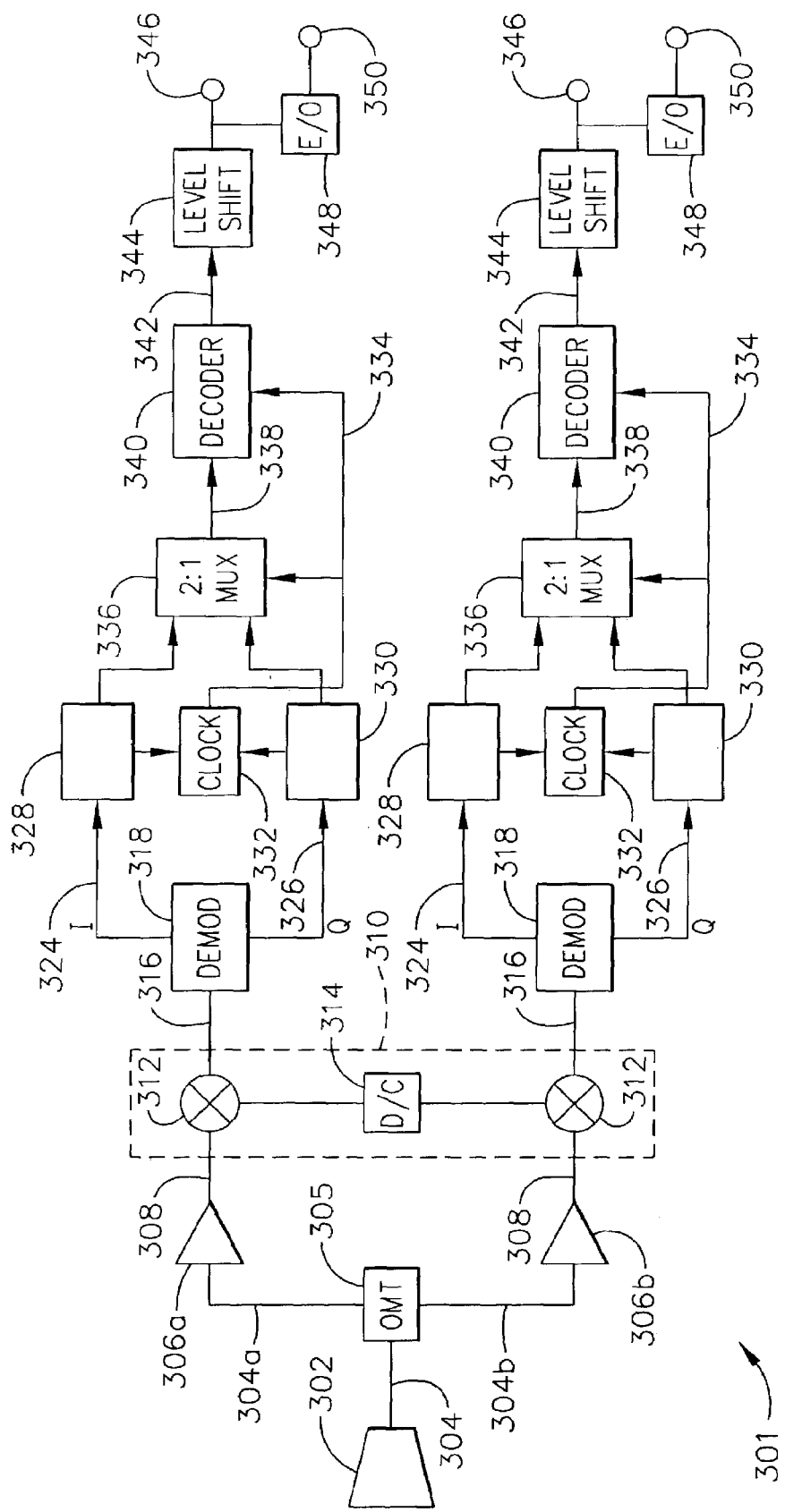
FIG. 3B is a block diagram illustrating dual polarization signal reception of uncompressed HDTV signals over a single channel, according to another embodiment of the present invention.

Referring now to FIGS. 3A and 3B, reception system 300 shown in FIG. 3A, illustrates RF reception, according to one embodiment, of an uncompressed HDTV signal—such as signal 108*a* or 108*b* seen in FIGS. 1A and 1B—that may be transmitted via a modulated carrier—such as modulated carrier 238—that may be received by a receiving antenna 302. The received uncompressed HDTV signal 304 may be passed to a low noise amplifier (LNA) 306.

In an alternative embodiment, illustrated by reception system 301 in FIG. 3B, uncompressed HDTV signal 304 may comprise an LHCP signal 304*a* and an RHCP signal 304*b*—such as signals 108*a* and 118*a* sent over a single RF channel 102*a* using a dual polarization technique. The two signals, LHCP signal 304*a* and RHCP signal 304*b*, may be separated by an ortho-mode transducer 305, so that LHCP signal 304*a* may be passed to low noise amplifier (LNA) 306*a* and RHCP signal 304*b* may be passed to low noise amplifier (LNA) 306*b*. The alternative embodiment shown in FIG. 3B uses dual polarization to allow two transmitters to broadcast to a single receiver site. The two transmitters must operate on different polarizations, right-hand circular and left-hand circular, in order to take advantage of frequency reuse. The receive antenna utilizes an ortho-mode transducer 305 to separate the left and right polarization for low noise amplification, frequency down conversion, and data recovery. This method allows for transmitting two signals each from a different transmitter over the same frequency region. The single polarization down converter of the embodiment shown in FIG. 3A may simplify the electronics for single channel use.

Referring again to FIGS. 3A and 3B, the amplified signal 308 may be down converted at block 310 by multiplying amplified signal 308, for example, using a multiplier 312 by the output of a local oscillator—such as local oscillator 314—to produce a down converted intermediate frequency (IF) signal or carrier 316 at a lower frequency than that of signal 304. For example, an IF between 1.5 GHz and 6 GHz may typically be chosen, so that a 2-GHz IF may be chosen to illustrate the present embodiment. In a practical implementation, for example, the functions of receiving antenna 302, LNA 306, and frequency down conversion of block 310 may be remotely located to provide optimum line-of-sight to a transmitter—such as transmitter 112*a* shown in FIG. 1A. The correct local oscillator source—such as local oscillator 314—may be combined with the incoming RF signal 308 to shift the signal 308 down to a 2 GHz IF carrier 316 at the output of block 310. Since the transmit frequency may not be fixed there can be numerous values for the local oscillator 314 in order to achieve the 2 GHz for IF carrier 316. A 2-GHz IF may be selected, for example, for simplification of routing. A 2-GHz IF may allow for significant distance between the receive antenna, which could be located on a crane or pole, and the baseband hardware, used to implement demodulation and decoding as further described below, located on the ground. A 2-GHz IF signal output can typically drive up to 100 feet of coaxial cable or be converted to an optical signal.

IF carrier 316 may be passed to demodulator 318 for recovery of the baseband digital signals corresponding to I data stream 224 and Q data stream 226. Demodulator 318, for example, may take a coherent carrier recovered from IF carrier 316 and mix the coherent carrier with the modulated IF carrier 316 to generate baseband I data stream 324 and Q data stream 326.

Bit synchronization and clock recovery may be performed on I data stream 324 and Q data stream 326, respectively, at blocks 328 and 330 to generate a clock 332 that is synchronized with I data stream 324 and Q data stream 326. Clock 332 may provide clock signal 334, providing a timing source for the 2:1 multiplexing at block 336 multiplexing I data stream 324 and Q data stream 326 to obtain a single stream of encoded HDTV data 338 corresponding to encoded data 218. Single stream of HDTV data 338 may be provided at a rate of 1.485 Gbps plus coding overhead. For example, the data rate with coding overhead given in the example above for encoded data 218 was 1.607 Gbps and, following that example, the data rate of single stream of HDTV data 338 may also be 1.607 Gbps. The encoded HDTV signal, i.e., HDTV data 338, may be supplied a timing source from clock signal 334, for example, at block 340, for decoding single stream of encoded HDTV data 338 to generate the error corrected 1.485 Gbps HDTV signal 342.

The logic levels of error corrected HDTV signal 342 may be shifted, for example, at block 344 after decoding to provide appropriate logic levels for adapting HDTV signal 342 to drive an electrical interface 346 or electrical to optical conversion may be performed at block 348 to drive optical interface 350.

Figure 4:
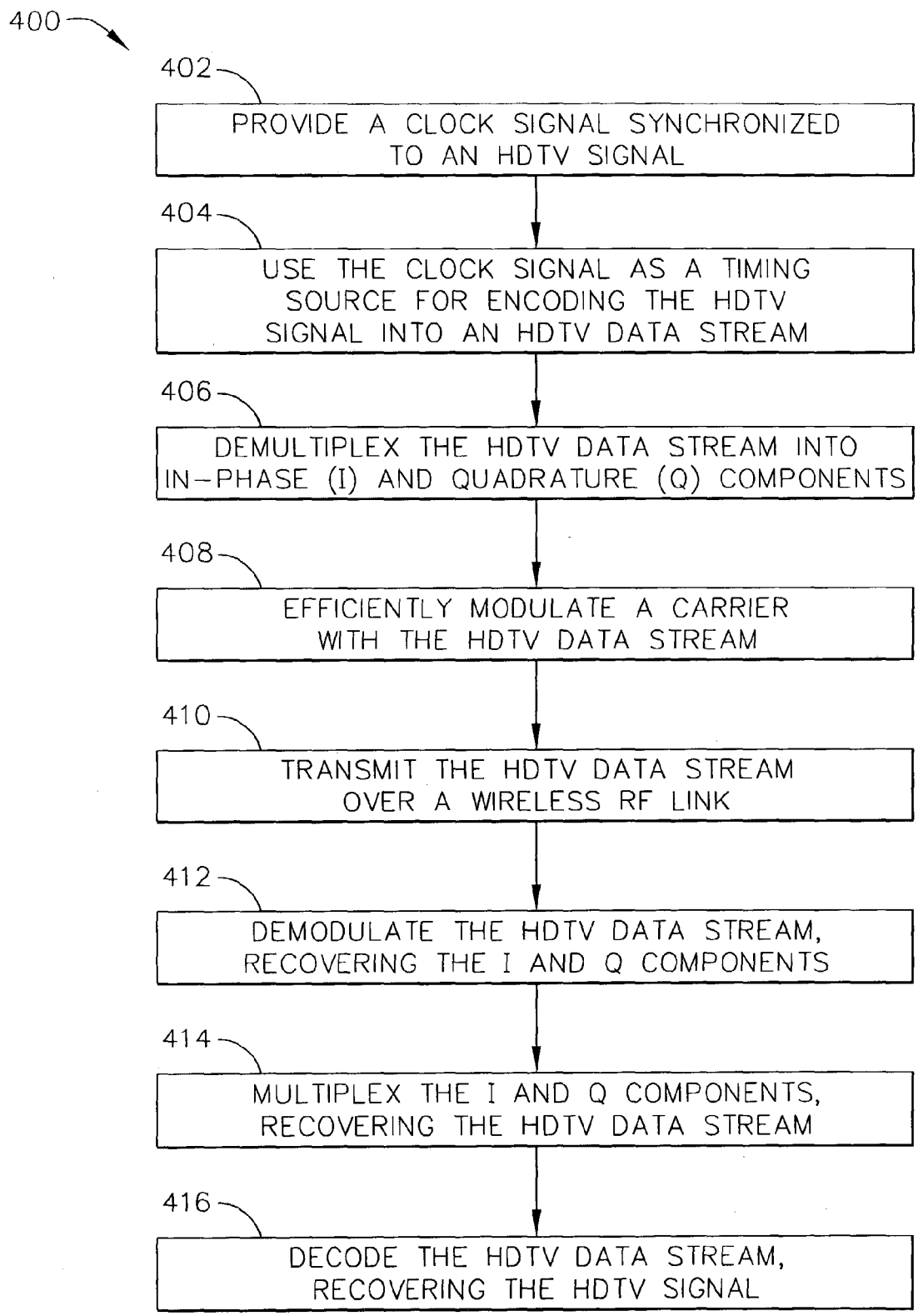
FIG. 4 is a flow chart illustrating a method for transmitting and receiving uncompressed HDTV signals, in accordance with an embodiment of the present invention.

Referring now to FIG. 4, an exemplary embodiment of a method 400 for transmitting and receiving an uncompressed HDTV signal—such as signal 108*a* or 108*b* seen in FIGS. 1A and 1B—is illustrated in flowchart form. Exemplary method 400 may include steps 402, 404, 406, 408, 410, 412, 414, and 416, which conceptually delineate method 400 for purposes of conveniently illustrating method 400 according to one embodiment. Exemplary method 400 is illustrated with reference to FIGS. 2, 3A and 3B.

Method 400 may begin with step 402, in which a clock signal may be synchronized to an HDTV signal. For example, data regeneration of equalized HDTV signal 206, or HDTV signal 108*a* or 108*b*, may be used with edge detection to provide synchronized clock signal 214.

Method 400 may continue with step 404, in which a synchronized clock signal may be used as a timing source for an encoder to encode the HDTV signal into an encoded data stream. For example, forward error correction coding—such as Reed-Solomon coding or turbo product coding—may be performed, in which synchronized clock signal 214 may be used as a timing source for the encoder to provide a stream of encoded data 218 from HDTV signal 206. A higher rate clock signal 220 may be generated from encoder block 216 using a PLL, in which higher clock rate signal 220 may be synchronized to the higher rate stream of encoded data 218.

Method 400 may continue with step 406, in which the encoded HDTV data stream may be demultiplexed into I and Q data streams. For example, higher rate synchronized clock signal 220 may enable demultiplexing of stream of encoded data 218 into I data stream 224 and Q data stream 226.

Method 400 may continue with step 408, in which an RF carrier may be efficiently modulated by the HDTV data stream. For example, an RF carrier may be QPSK modulated by I data stream 224 and Q data stream 226 to provide modulated carrier 238. Other types of efficient modulation may also be used, for example, 16 QAM or other higher orders of modulation.

Method 400 may continue with step 410, in which the HDTV data stream may be transmitted over a wireless RF link. For example, modulated carrier 238 may be transmitted from a transmit antenna 236 to a receiving antenna 302.

Method 400 may continue with step 412, in which an HDTV data stream may be demodulated from a carrier to recover I and Q data streams. For example, an IF carrier 316 may be demodulated to recover an I data stream 324 and a Q data stream 326.

Method 400 may continue with step 414, in which I and Q data streams may be multiplexed into a single encoded HDTV data stream. For example, I data stream 324 and Q data stream 326 may be multiplexed into a single stream of encoded HDTV data 338, which effectively recovers the transmitted encoded data 218. I data stream 324 and Q data stream 326 may be multiplexed with the aid of a clock signal 334 generated by clock data recovery using edge detection, for example, from I data stream 324 and Q data stream 326.

Method 400 may continue with step 416, in which HDTV data stream may be decoded into an error corrected HDTV signal—such as HDTV signal 342, meeting the SMPTE 292M standard—that effectively recovers the original HDTV signal—such as signal 108*a* or 108*b*.

It should be understood, of course, that the foregoing relates to preferred embodiments of the invention and that modifications may be made without departing from the spirit and scope of the invention as set forth in the following claims.

We claim:

1. A method for transmitting and receiving an uncompressed HDTV signal over a wireless RF link, comprising the steps of:
    providing a stream of regenerated data having a first data rate of 1.485 Gbps from the uncompressed HDTV signal;
    providing a first clock signal using edge detection of said stream of regenerated data to generate said first clock signal synchronized to said stream of regenerated data;
    encoding said stream of regenerated data using a forward error correction code, producing a stream of encoded data having a second data rate higher than said first data rate by a coding overhead of said forward error correction code;
    providing a second clock signal using a PLL to generate said second clock signal synchronized to said stream of encoded data, said second clock signal having a rate higher than said first clock signal by said coding overhead;
    demultiplexing said stream of encoded data, using said second clock signal, into an in-phase (I) data stream and a quadrature (Q) data stream;
    QPSK modulating an IF carrier by said I data stream and said Q data stream;
    up converting said IF carrier to an RF signal;
    transmitting said RF signal over the wireless RF link;
    receiving said RF signal over the wireless RF link;
    down converting said RF signal to an IF frequency carrier having frequency greater than 1.5 GHz and less than 6 GHz;
    demodulating said IF frequency carrier so that said I data stream and said Q data stream are recovered;
    generating a third clock signal from said recovered I data stream and Q data stream, said third clock signal synchronized to said recovered I data stream and Q data stream;
    multiplexing said recovered I data stream and Q data stream, using said third clock signal, into a single stream of encoded HDTV data; and
    decoding said single stream of encoded HDTV data, using said third clock signal, so that the uncompressed HDTV signal is recovered.

2. The method of claim 1, further comprising the steps of:
    transmitting a first uncompressed HDTV signal using a left hand circular polarization (LHCP) signal;
    transmitting a second uncompressed HDTV signal using a right hand circular polarization (RHCP) signal;
    separating said LHCP signal from said RHCP signal using an ortho-mode transducer at a receiver;
    recovering said first uncompressed HDTV signal from said LHCP signal; and
    recovering said second uncompressed HDTV signal from said RHCP signal.

3. A method of providing a wireless RF link for an HDTV system, comprising the steps of:
    performing data regeneration on an uncompressed HDTV signal, producing a stream of regenerated HDTV data;
    synchronizing a first clock signal to said stream of regenerated HDTV data;
    encoding said stream of regenerated HDTV data, producing a stream of encoded data;
    synchronizing a second clock signal to said stream of encoded data;
    demultiplexing said stream of encoded data, using said second clock signal, into an in-phase (I) data stream and a quadrature (Q) data stream;
    modulating a carrier by said I data stream and said Q data stream;
    transmitting said carrier in a signal over the wireless RF link;
    receiving said signal over the wireless RF link;
    demodulating said carrier so that said I data stream and said Q data stream are recovered;
    generating a third clock signal from said recovered I data stream and Q data stream, said third clock signal synchronized to said recovered I data stream and Q data stream;
    using said third clock signal to multiplex said recovered I data stream and Q data stream into a single stream of HDTV data; and
    decoding said single stream of HDTV data so that said uncompressed HDTV signal is recovered.

4. The method of claim 3, wherein
    said stream of regenerated data has a data rate of 1.485 Gbps; and
    said step of synchronizing said first clock signal to said stream of regenerated HDTV data comprises using edge detection of said stream of regenerated HDTV data to generate said first clock signal.

5. The method of claim 3, wherein:
    said step of encoding said stream of regenerated HDTV data comprises using a forward error correction code; and
    said stream of encoded data has a second data rate higher than 1.485 Gbps by a coding overhead of said forward error correction code; and said second clock signal has a rate higher than said first clock signal by said coding overhead.

6. The method of claim 3, wherein said step of synchronizing said first clock signal to said stream of regenerated HDTV data comprises using a "times-2" multiplier with said stream of regenerated HDTV data to generate said first clock signal.

7. The method of claim 3, wherein said step of synchronizing said second clock signal comprises using a PLL synchronized to said stream of encoded data to generate said second clock signal.

8. The method of claim 3, wherein said step of encoding said stream of regenerated data comprises turbo product coding.

9. The method of claim 3, wherein said step of modulating said carrier comprises using a higher order of modulation of said carrier by said I data stream and said Q data stream.

10. The method of claim 3, wherein said step of modulating said carrier comprises 16 QAM modulation of said carrier by said I data stream and said Q data stream.

11. The method of claim 3, wherein said third clock signal is used as a timing source for decoding said single stream of HDTV data.

12. The method of claim 3, wherein said step of receiving said signal comprises down converting said signal to said carrier having an IF frequency greater than 1.5 GHz and less than 6 GHz.

13. The method of claim 3, further comprising the steps of:
transmitting a first signal with left hand circular polarization over said wireless RF link;
transmitting a second signal with right hand circular polarization over said wireless RF link;
separating said first signal from said second signal using an ortho-mode transducer at a receiver;
recovering a first uncompressed HDTV signal from said first signal; and
recovering a second uncompressed HDTV signal from said second signal.

14. A method for transmitting and receiving an uncompressed HDTV signal over a link, comprising the steps of:
providing a clock signal synchronized to the uncompressed HDTV signal;
providing a stream of regenerated data from the uncompressed HDTV signal, said clock signal synchronized to said stream of regenerated data;
encoding said stream of regenerated data, producing a stream of encoded data;
providing a second clock signal synchronized to said stream of encoded data
demultiplexing said stream of regenerated data, using said second clock signal, into an in-phase (I) data stream and a quadrature (Q) data stream;
modulating a carrier with said I data stream and said Q data stream;
transmitting said carrier in a signal over the link;
demodulating said carrier so that said I data stream and said Q data stream are recovered;
multiplexing said recovered I data stream and said Q data stream into a single stream of HDTV data; and
recovering the uncompressed HDTV signal from said single stream of HDTV data.

15. The method of claim 14, wherein said step of providing said second clock signal synchronized to said stream of encoded data comprises using a PLL to generate said second clock signal.

16. The method of claim 14, wherein said step of encoding said stream of regenerated data comprises forward error correction coding.

17. An apparatus adapted to transmit a wireless signal comprising:
a receiver adapted to receive an uncompressed HDTV signal;
a module adapted to provide a stream of regenerated data from the uncompressed HDTV signal;
a first clock adapted to generate a first clock signal synchronized to the uncompressed HDTV signal, said first clock signal synchronized to said stream of regenerated data;
an encoder adapted to encode said stream of regenerated data to produce a stream of encoded data;
a second clock adapted to produce a second clock signal synchronized to said stream of encoded data,
a demultiplexer adapted to demultiplex said stream of regenerated data using said second clock signal, into an in-phase (I) data stream and a quadrature (Q) data stream;
a modulator adapted to modulate a carrier with said I data stream and said Q data stream; and
a transmitter adapted to transmit said carrier in a signal over a wireless RF link.

18. The apparatus of claim 17, wherein said second clock uses a PLL to generate said second clock signal.

19. The apparatus of claim 17, wherein said encoder encodes using forward error correction coding.

20. A machine-readable medium for programming a computer to transmit and receive an uncompressed HDTV signal over a wireless RF link, said medium including processor executable instructions comprising:
providing a clock signal synchronized to the uncompressed HDTV signal;
providing a stream of regenerated data from the uncompressed HDTV signal, said clock signal synchronized to said stream of regenerated data;
encoding said stream of regenerated data, producing a stream of encoded data;
providing a second clock signal synchronized to said stream of encoded data;
demultiplexing said stream of regenerated data, using said second clock signal, into an in-phase (I) data stream and a quadrature (Q) data stream;
modulating a carrier with said I data stream and said Q data stream;
transmitting said carrier in a signal over the wireless RF link;
demodulating said carrier so that said I data stream and said Q data stream are recovered;
multiplexing said recovered I data stream and Q data stream into a single stream of HDTV data; and
recovering the uncompressed HDTV signal from said single stream of HDTV data.

21. The machine-readable medium of claim 20, wherein said processor executable instruction of providing said clock signal synchronized to the uncompressed HDTV signal comprises using a "times-2" multiplier with said uncompressed HDTV signal to generate said clock signal.

22. The machine-readable medium of claim 20, wherein said processor executable instruction of providing said second clock signal synchronized to said stream of encoded data comprises using a PLL to generate said second clock signal.

23. The machine-readable medium of claim 20, wherein said processor executable instruction of encoding said stream of regenerated data comprises forward error correction coding.

24. A system for transmitting and receiving an uncompressed HDTV signal over a wireless RF link, comprising:
a clock that provides a clock signal synchronized to the uncompressed HDIV signal;
a data regeneration module connected to said clock and that provides a stream of regenerated data from the uncompressed HDTV signal, wherein said clock signal is synchronized to said stream of regenerated data;
a demultiplexer that demultiplexes said stream of regenerated data into an in-phase (I) data stream and a quadrature (Q) data stream;
an encoder connected to said data regeneration module and said clock and that encodes said stream of regenerated data, producing a stream of encoded data; and provides a second clock signal synchronized to said stream of encoded data; and wherein:
said demultiplexer demultiplexes said stream of encoded data, using said second clock signal, into said I data stream and said Q data stream;
a modulator connected to said demultiplexer that modulates a carrier with said I data stream and said Q data stream;
a demodulator that receives said carrier and demodulates said carrier so that said I data stream and said Q data stream are recovered;
a multiplexer connected to said demodulator and that multiplexes said recovered I data stream and Q data stream into a single stream of HDTV data that recovers the uncompressed HDTV signal.

25. The system of claim 24, wherein said encoder includes a PLL that generates said second clock signal.

26. The system of claim 24, wherein said encoder performs forward error correction coding of said stream of regenerated data.

27. A system for transmitting an uncompressed HDTV signal over a wireless RF link, comprising:
a data regeneration module that provides a stream of regenerated data from the uncompressed HDTV signal;
a clock that provides a first clock signal synchronized to said stream of regenerated data;
an encoder connected to said clock and to said data regeneration module and that encodes said stream of regenerated data, producing a stream of encoded data, and that provides a second clock signal synchronized to said stream of encoded data;
a demultiplexer connected to said encoder that demultiplexes said stream of encoded data, using said second clock signal, into an in-phase (I) data stream and a quadrature (Q) data stream; and
a modulator connected to said demultiplexer that modulates a carrier with said I data stream and said Q data stream.

28. The system of claim 27, wherein:
said encoder encodes said stream of regenerated data using a forward error correction code;
said stream of regenerated data has a first data rate of 1.485 Gbps; and
said stream of encoded data has a second data rate higher than said first data rate by a coding overhead of said forward error correction code; and said second clock signal has a rate higher than said first clock signal by said coding overhead.

29. The system of claim 27, wherein said clock uses edge detection of said stream of regenerated data to generate said first clock signal.

30. The system of claim 27, wherein said clock uses a "times-2" multiplier with said stream of regenerated data to generate said first clock signal.

31. The system of claim 27, wherein said encoder includes a PLL that synchronizes said second clock signal to said stream of encoded data.

32. The system of claim 27, wherein said encoder performs Reed-Solomon forward error correction coding of said stream of regenerated data.

33. The system of claim 27, wherein said modulator is a 16-QAM (quadrature amplitude modulation) monolithic microwave integrated circuits (MMIC) modulator.

34. The system of claim 27, further comprising:
a local oscillator connected to said modulator, said local oscillator providing a frequency in the range of 18–22 GHz;
a multiplier connected to said modulator and to said local oscillator so that said carrier has a center frequency twice the frequency of said local oscillator.

35. An HDTV system that transmits and receives an uncompressed HDTV signal over a wireless RF link, said HDTV system comprising:
a data regeneration module that provides a stream of regenerated data, having a first data rate of 1.485 Gbps, from the uncompressed HDTV signal;
a first clock that provides a first clock signal synchronized to said stream of regenerated data wherein said first clock uses edge detection of said stream of regenerated data to generate said first clock signal;
an encoder connected to said clock and to said data regeneration module and that encodes said stream of regenerated data using a Reed-Solomon forward error correction code, producing a stream of encoded data, and that includes a PLL that provides a second clock signal synchronized to said stream of encoded data, wherein said stream of encoded data has a second data rate higher than said first data rate by a coding overhead of said Reed-Solomon forward error correction code; and said second clock signal has a rate higher than said first clock signal by said coding overhead;
a demultiplexer connected to said encoder that demultiplexes said stream of encoded data, using said second clock signal, into an in-phase (I) data stream and a quadrature (Q) data stream;
a modulator connected to said demultiplexer that modulates a carrier by said I data stream and said Q data stream;
a receiver front end that down converts an RF signal to an IF frequency carrier with an IF frequency greater than 1.5 GHz and less than 6 GHz;
a demodulator connected to said receiver front end and that receives said IF frequency carrier and demodulates said IF frequency carrier so that said I data stream and said Q data stream are recovered;
a second clock that generates a third clock signal from said recovered I data stream and Q data stream, said third clock signal synchronized to said recovered I data stream and Q data stream;
a multiplexer connected to said demodulator and to said second clock and that uses said third clock signal to multiplex said recovered I data stream and Q data stream into a single stream of encoded HDTV data; and a decoder connected to said multiplexer and that uses said third clock signal to decode said single stream of encoded HDTV data so that the uncompressed HDTV signal is recovered.

36. The HDTV system of claim 35, further comprising:

an ortho-mode transducer that separates a left-hand circular polarization signal carrying a first uncompressed HDTV signal from a right-hand circular polarization signal carrying a second uncompressed HDTV signal.

37. A method for transmitting an uncompressed HDTV signal over a wireless RF link, comprising the steps of:

providing a stream of regenerated data from the uncompressed HDTV signal;

providing a first clock signal synchronized to said stream of regenerated data;

encoding said stream of regenerated data, producing a stream of encoded data;

providing a second clock signal synchronized to said stream of encoded data;

demultiplexing said stream of encoded data, using said second clock signal, into an in-phase (I) data stream and a quadrature (Q) data stream;

modulating a carrier with said I data stream and said Q data stream; and transmitting said carrier in a signal over the wireless RF link.

38. The method of claim 37, wherein:

said step of encoding said stream of regenerated data comprises using a forward error correction code;

said stream of regenerated data has a first data rate of 1.485 Gbps;

said stream of encoded data has a second data rate higher than said first data rate by a coding overhead of said forward error correction code; and said second clock signal has a rate higher than said first clock signal by said coding overhead.

39. The method of claim 37, wherein said step of providing said first clock signal synchronized to said stream of regenerated data comprises using edge detection of said stream of regenerated data to generate said first clock signal.

40. The method of claim 37, wherein said step of providing said first clock signal synchronized to said stream of regenerated data comprises using a "times-2" multiplier with said stream of regenerated data to generate said first clock signal.

41. The method of claim 37, wherein said step of providing said second clock signal comprises using a PLL that synchronizes said second clock signal to said stream of encoded data.

42. The method of claim 37, wherein said step of encoding said stream of regenerated data comprises Reed-Solomon forward error correction coding.

43. The method of claim 37, wherein said step of modulating said carrier comprises quadrature phase shift keying (QPSK) modulation of an IF carrier by said I data stream and said Q data stream and frequency upconversion of said IF carrier to a radio frequency signal.

44. The method of claim 37, wherein said step of transmitting said carrier in said signal comprises transmitting said signal with a circular polarization.

* * * * *